United States Patent
Luo et al.

(10) Patent No.: US 6,492,875 B2
(45) Date of Patent: Dec. 10, 2002

(54) SELF-BOOSTING CIRCUIT FOR A POWER AMPLIFIER

(75) Inventors: Sifen Luo, Hartsdale; Tirdad Sowlati, Ossining, both of NY (US); Chris Joly, North Providence, RI (US); Kerry Burger, Lincoln, NE (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/730,657

(22) Filed: Dec. 6, 2000

(65) Prior Publication Data

US 2002/0067209 A1 Jun. 6, 2002

(51) Int. Cl.[7] .............................. H03F 3/04; H03G 3/10
(52) U.S. Cl. ....................................... 330/296; 330/285
(58) Field of Search .................................. 330/285, 296

(56) References Cited

U.S. PATENT DOCUMENTS

| | | | |
|---|---|---|---|
| 5,060,294 A | * | 10/1991 | Schwent et al. |
| 5,243,301 A | * | 9/1993 | Tondryk |
| 5,345,192 A | * | 9/1994 | Green |
| 5,548,248 A |   | 8/1996 | Wang .......................... 330/288 |
| 5,670,912 A | * | 9/1997 | Zocher |
| 5,844,443 A |   | 12/1998 | Wong .......................... 330/275 |
| 5,995,814 A | * | 11/1999 | Yeh |

* cited by examiner

Primary Examiner—Patricia Nguyen
(74) Attorney, Agent, or Firm—Steven R. Biren

(57) ABSTRACT

A power amplifier circuit includes an amplifying transistor and a dc bias circuit for biasing the amplifier transistor to obtain a conduction angle of at least about 180°. The dc bias circuit includes a self-bias boosting circuit for initially decreasing and then increasing the dc bias voltage provided to a control terminal of the amplifying transistor by the dc bias circuit as the input signal provided to the power amplifier increases. The self-bias boosting circuit is extremely simple and compact in design, and permits the power amplifier circuits to operate in Class B or Class AB with improved power output characteristics.

5 Claims, 1 Drawing Sheet

SELF-BOOSTING CIRCUIT FOR A POWER AMPLIFIER

BACKGROUND OF THE INVENTION

The invention is in the field of transistor amplifier circuits, and relates more particularly to a power amplifier circuit having a self-bias boosting circuit for increasing maximum power output and reducing power dissipation at low power levels.

Amplifiers of this general type are frequently used in high-frequency RF amplifiers, as well as in audio amplifiers and other applications. In order to obtain a linear input-output relationship and high operating efficiency, such amplifiers are typically operated with a conduction angle of about 180° (Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output. To avoid this power reduction, the amplifier must have a larger quiescent bias. In prior-art circuitry this inevitably leads to a higher power dissipation at low power output levels and therefore an undesirable tradeoff in operating characteristics.

A recent improvement in this art is disclosed in co-pending U.S. patent application Ser. No. 09/536,946, entitled Dynamic Bias Boosting Circuit For A Power Amplifier, filed on Mar. 28, 2000 by Sowlati and Luo, two of the present inventors. This application discloses a solution to the problem discussed above which entails providing the power amplifier circuit with a dynamic bias boosting circuit to dynamically increase the bias of the power transistor as the output power increases by using a circuit that senses the input voltage to the amplifier and generates a dynamic bias boost as a function of the amplitude of this signal. The drawback to this solution is that it employs numerous active and passive components, thus not maximizing simplicity, compactness and economy of manufacture.

Accordingly, it would be desirable to have a power amplifier circuit which offers the advantages of optimum maximum output power and reduced power dissipation at low power levels. Additionally, it would be desirable for such a circuit to be extremely simple and compact in design, and very economical to manufacture.

SUMMARY OF THE INVENTION

It is therefore an object of the present invention to provide a power amplifier circuit which provides improved maximum output power and less power dissipation at low power levels. It is a further object of the invention to provide a power amplifier circuit which is both extremely simple and compact in design and which is very economical to manufacture.

In accordance with the invention, these objects are achieved by a new power amplifier circuit for amplifying an input signal and having a conduction angle of at least about 180°, the amplifier circuit including an amplifying transistor and a dc bias circuit for biasing the amplifier transistor to obtain the desired conduction angle. The dc bias circuit includes a self-bias boosting circuit for initially decreasing and then increasing the dc bias voltage provided to a control terminal of the amplifying transistor by the dc bias circuit as the input signal provided to the power amplifier increases.

In a preferred embodiment of the invention, the amplifier circuit is either a Class B or a Class AB amplifier circuit.

In a further preferred embodiment of the invention, the self-bias boosting circuit includes a capacitor coupled from an output terminal of the self-bias boosting circuit to a common terminal, and a resistor coupled between the output terminal and the control terminal of the amplifying transistor.

In yet a further preferred embodiment of the invention, the self-bias boosting circuit also includes a switch coupled in series with the capacitor for enabling the power amplifier circuit to operate in either of two output power modes.

A power amplifier circuit in accordance with the present invention offers a significant improvement in that a particularly advantageous combination of features, including increased maximum output power and reduced power dissipation at low power levels, can be obtained in an extremely simple, compact and economical configuration.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

In the drawing, like reference numerals are generally used to designate like components.

DESCRIPTION OF THE PREFERRED EMBODIMENTS

Figure 1:
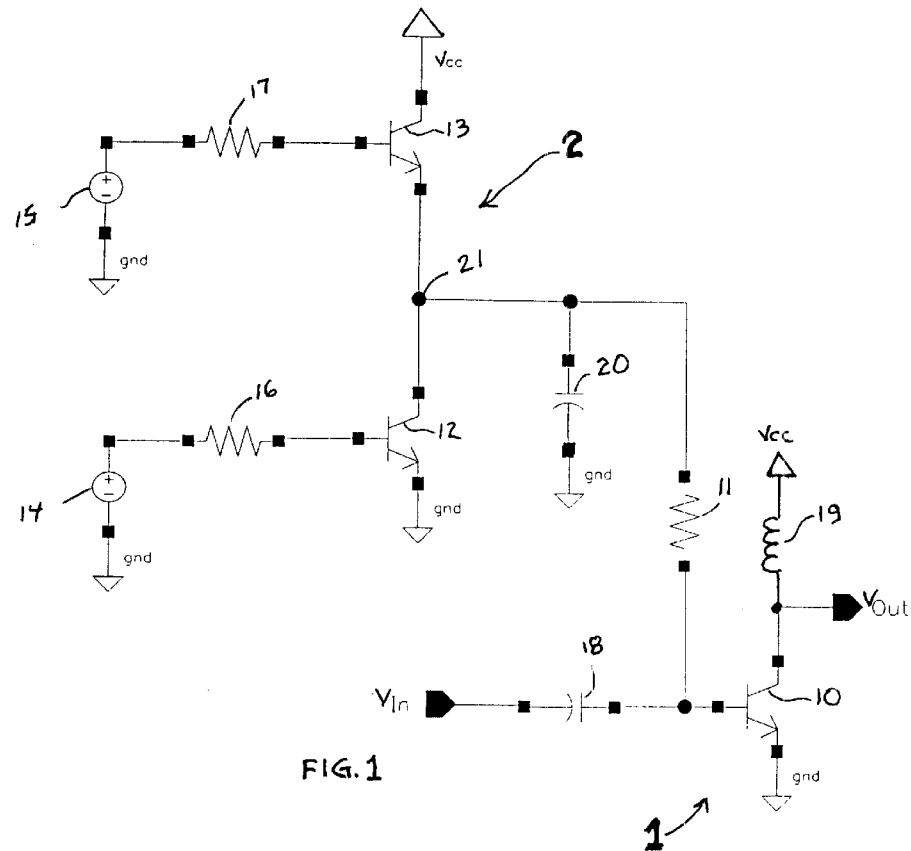
FIG. 1 shows a simplified schematic diagram of a power amplifier circuit in accordance with a first embodiment of the invention.

A simplified schematic diagram of a high-frequency power amplifier circuit 1 is shown in FIG. 1 of the drawing. The amplifier circuit includes an amplifying transistor 10 and a bias circuit 2 coupled to the base of the amplifying transistor 10 by a resistor 11. The bias circuit 2 includes bipolar transistors 12 and 13, coupled in series between $V_{cc}$ and a common terminal (GND) with the transistors being coupled to bias voltage supplies shown in simplified form by bias voltage supplies 14 and 15 coupled to the bases of transistors 12 and 13, respectively, by resistors 16 and 17. The basic circuit configuration is completed by an input coupling capacitor 18 for coupling an input signal $V_{in}$ to the base of amplifying transistor 10, with the transistor 10 being connected in a common-emitter configuration and coupled between $V_{cc}$ and GND by an inductor 19. The output of power amplifier circuit 1 is taken from the collector of transistor 10 and is designated as $V_{out}$ in the drawing.

In connection with the circuit as so far described, it should be understood that although the active components are shown as bipolar transistors for illustrative purposes, field effect transistors or a combination of bipolar and field effect transistors may alternatively be used within the scope of the invention. Additionally, it is to be understood that the power amplifier circuit 1 and bias circuit 2 may differ in form and detail from the simplified, illustrative depictions shown in the drawing. Furthermore, it is to be understood that the bias supply may be configured and adjusted to permit the amplifier circuit to operate in either Class B or Class AB mode.

In accordance with the invention, capacitor 20 is coupled from an output terminal 21 of the bias circuit 2 to a common terminal (here GND) in order to achieve a self-bias boost feature in an extremely simple, compact and economical manner. In an illustrative but nonlimiting example, in a circuit suitable for use at wireless telephone communication frequencies, capacitor 20 may have a value of about 2.2 pF and resistor 11 may have a value of about 15 ohms. Additionally, in a practical implementation, the bias voltages supplied to transistors 12 and 13 by components 14, 15, 16 and 17 could be supplied by other bias circuits already existing in other portions of a device incorporating the power amplifier circuit of the invention, thus further simplifying the circuit and reducing cost and size.

As opposed to more complex and costly prior-art bias control circuits, the present invention provides an extremely simple and automatic improvement in circuit performance by using capacitor 20 together with the other circuit components, with the capacitor acting as a self-bias booster in the amplifier circuit, in a manner which will be explained in further detail below.

Figure 2:
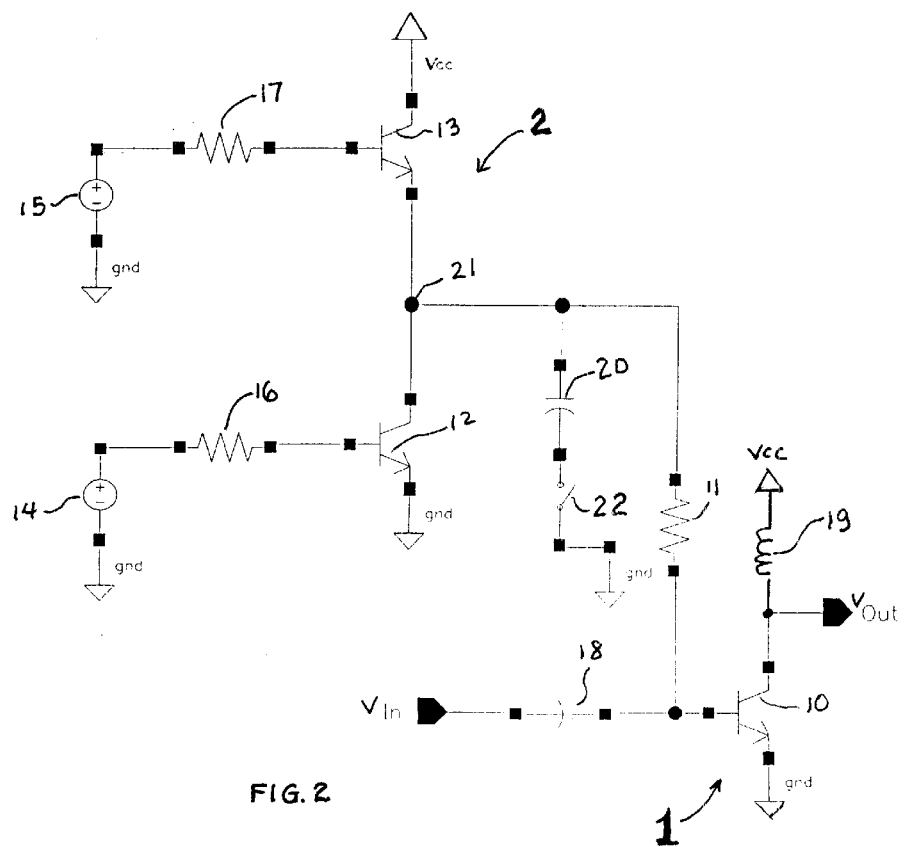
FIG. 2 shows a simplified schematic diagram of a power amplifier circuit in accordance with a second embodiment of the invention.

A further preferred embodiment of the invention is shown in the simplified schematic diagram of FIG. 2. The circuit shown in FIG. 2 incorporates all of the components of FIG. 1, with like reference numerals designating like components, and accordingly these components will not be described further here. The circuit of FIG. 2 differs from FIG. 1 in that it additionally includes a switch 22 coupled in series with capacitor 20, so that the two series-connected components are connected between terminal 21 and GND. In this manner, with the addition of only a single additional component, the power amplifier circuit can operate in either of two different output power modes, namely a higher power mode (in which capacitor is connected to ground) and a lower output power mode (in which switch 22 is opened to disconnected capacitor 20 from the circuit). When the circuit is used in wireless communication applications, for example, this dual power mode embodiment may be employed to switch power levels in order to enable operation in both analog and digital modes, which typically employ different power levels. Although circuit element 22 is shown in FIG. 2 as a simple switch, it will be understood that this component may be implemented in practice by either a mechanical switch or a semiconductor device such as a transistor or a PIN diode.

In the foregoing circuits, the capacitor 20 acts as a self-bias booster in the amplifier circuit. This feature, when used with proper input and output matching networks, will provide improved maximum output power and less power dissipation at low power levels.

In order to better understand the operation of the instant invention, consider the operation of the circuit of FIG. 2 with switch 22 opened so that capacitor 20 is effectively disconnected. In this mode, the average voltage drop across resistor 11 will increase as the RF input level ($V_{in}$) increases. This will in turn cause a reduction in the base-emitter voltage of transistor 10, thus pushing this transistor into saturation. When switch 22 is closed, thus connecting capacitor 20 into the circuit, the base-emitter voltage of transistor 10 will initially decrease and then subsequently increase as the input signal provided to the power amplifier circuit increases, thus helping transistor 10 to stay within the desired operating region and permitting improved maximum output power within the desired mode of operation.

It is to be emphasized that although the improvement in the invention is extremely simple, compact and economical to implement, it is based upon a recognition of certain operating conditions that are not apparent or obvious. More particularly, the invention is based upon a recognition that, at lower input power levels, the discharging rate of capacitor 20 through transistor 12 is equal to or faster than its charging rate through transistors 10 and 13. At higher power levels, on the contrary, the discharging rate of capacitor 20 becomes slower than its charging rate. Accordingly, as the input signal provided to the power amplifier circuit is increased, the DC bias voltage provided to the base of transistor 10 will initially decrease and then increase, thus providing the desired self-bias boosting effect in an extremely simple and economical manner. Computer simulations indicate that the provision of this single component (capacitor 20) can improve the maximum output power available by up to about 40%.

While the invention has been particularly shown and described with reference to several preferred embodiments thereof, it will be understood by those skilled in the art that various changes in form and detail, some of which have been suggested above, may be made without departing from the spirit or scope of the invention. Thus, for example, different types of transistors may be employed, and alterations to the circuit configuration may be made to suit particular design requirements.

What is claimed is:

1. A power amplifier circuit for amplifying an input signal and having a conduction angle of at least about 180°, said power amplifier circuit comprising an amplifying transistor and a dc bias circuit for biasing said amplifying transistor to obtain said conduction angle, and said dc bias circuit comprising a self-bias boosting circuit resistively coupled to said amplifying transistor for initially decreasing and then increasing a dc bias voltage provided to a control terminal of said amplifying transistor by said dc bias circuit as said input signal provided to said power amplifier circuit increases.

2. A power amplifier circuit as in claim 1, wherein said amplifier circuit is a Class B amplifier circuit.

3. A power amplifier circuit as in claim 1, wherein said amplifier circuit is a Class AB amplifier circuit.

4. A power amplifier circuit as in claim 1, wherein said self-bias boosting circuit comprises a capacitor coupled from an output terminal of said self-bias boosting circuit to a common terminal, and a resistor coupled between said output terminal and said control terminal of the amplifying transistor.

5. A power amplifier circuit as claimed in claim 4, further comprising a switch coupled in series with said capacitor for enabling said power amplifier circuit to operate in either of two output power modes.

* * * * *